United States Patent [19]
Silver

[11] Patent Number: 5,952,846
[45] Date of Patent: Sep. 14, 1999

[54] METHOD FOR REDUCING SWITCHING NOISE IN A PROGRAMMABLE LOGIC DEVICE

[75] Inventor: Joshua M. Silver, Sunnyvale, Calif.

[73] Assignee: Xilinx, Inc., San Jose, Calif.

[21] Appl. No.: 08/908,817

[22] Filed: Aug. 8, 1997

[51] Int. Cl.$^6$ .................................................. H03K 19/177
[52] U.S. Cl. ............................................... 326/41; 326/39
[58] Field of Search .................................. 326/21, 26, 39, 326/41, 38

[56] References Cited

U.S. PATENT DOCUMENTS

| | | | |
|---|---|---|---|
| 4,903,223 | 2/1990 | Norman et al. | 326/39 |
| 5,028,821 | 7/1991 | Kaplinsky . | |
| 5,091,661 | 2/1992 | Chiang | 326/41 |
| 5,530,378 | 6/1996 | Kucharewski et al. | 326/41 |
| 5,617,041 | 4/1997 | Lee et al. | 326/39 |

OTHER PUBLICATIONS

Xilinx Programmable Gate Array Data Book, 1996, pp. 3–3 to 3–16, available from Xilinx, Inc., 2100 Logic Drive, San Jose, California 95124., No Month.

Primary Examiner—Michael Tokar
Assistant Examiner—Don Phu Le
Attorney, Agent, or Firm—Patrick T. Bever; Bever & Hoffman; Jeanette S. Harms

[57] ABSTRACT

A method for programming PLDs in which feedback signals are alternately programmed to produce counteractive switching signals in the interconnect matrix to reduce the coupling effect caused by multiple concurrent switching events. The method is applied to CPLDs having interconnect matrices including input lines and output lines connected by programmable connection circuits, and having macrocells connected at their output to one of the input lines via first selective inversion circuits, and connected at their input to the output lines via second selective inversion circuits. The method includes selecting a first macrocell generating a feedback signal which is routed to a second macrocell, generating a random command to either invert or not-invert the feedback signal, and, if the generated random command is to invert the feedback signal, programming the associated first selective inversion circuit to invert the feedback signal as it enters the interconnect matrix, and programming the associated second selective signal inversion circuit to re-invert the inverted feedback signal transmitted from the interconnect matrix to the second macrocell.

10 Claims, 6 Drawing Sheets

METHOD FOR REDUCING SWITCHING NOISE IN A PROGRAMMABLE LOGIC DEVICE

TECHNICAL FIELD

The present invention relates to programmable logic devices (PLDs), and in particular a method for reducing switching noise in the interconnect matrix of a complex programmable logic device (CPLD).

BACKGROUND ART

Programmable logic devices (PLDs) are a class of integrated circuits (ICs) which can be programmed by a user to implement the user's logic functions. PLDs are often used in electronic systems because, unlike custom hardwired or "application specific" integrated circuits (ASICs), PLDs can be programmed in a relatively short amount of time, and often can be reprogrammed quickly to incorporate modifications to the implemented logic function.

One major class of PLDs are referred to as programmable logic array (PLA) devices or programmable array logic (PAL) devices. Basically, these early PLDs include an AND plane which ANDs two or more input signals to produce product terms (P-terms), and an OR plane which ORs two or more of the P-terms generated by the AND plane. The AND plane is typically formed as a matrix of programmable connections where each column connects to an input pin of the PLD, and each row forms a P-term which is transmitted to the OR plane. The OR plane may be programmable (i.e., each P-term is programmably connectable to one of several different OR plane outputs), in which case the PLD is referred to as a PLA device. Alternatively, the OR plane may be fixed (i.e., each P-term is assigned to a particular OR plane output), in which case the PLD is referred to as a PAL device. The AND plane and OR plane of PLA and PAL devices implement logic functions represented in the sum-of-products form.

PLA and PAL devices were well-received by logic designers when their implemented logic functions were relatively small. However, as logic functions grew increasingly larger and more complex, logic designers were required to wire together two or more small PLDs to provide sufficient logic capacity. Although this process was tolerated during development and testing, it increased the cost and size of production units. This generated a demand for PLDs with increasingly larger logic capacity.

To meet the ever-increasing demand for greater capacity, PLDs with increasingly complex architectures have been developed. One popular complex PLD type, known as complex programmable logic devices (CPLDs), includes two or more function blocks connected together and to input/output (I/O) modules by an interconnect matrix such that each of the function blocks selectively communicates with the I/O modules and with other function blocks of the CPLD through the interconnect matrix. Each function block of the CPLD is structured like the two-level PLDs, described above. In effect, these CPLDs incorporate several early PLDs and associated connection circuitry onto a single integrated circuit. This provides a circuit designer the convenience of implementing a complex logic function using a single IC.

Each function block of an early CPLD typically includes an AND array and a set of macrocells. The AND array includes a set of input lines for receiving input signals from the interconnect matrix, and a set of product term (P-term) lines for transmitting P-term signals to the macrocells. Each P-term line is connected to the input lines using programmable connections which allow logic ANDing of two or more of the input signals. Each macrocell includes an OR gate which is programmable to receive one or more of the P-term signals transmitted on the P-term lines. The OR gate of each macrocell produces a sum-of-products term which is either transmitted to the I/O modules of the CPLD, fed back through the interconnect matrix, or is transmitted on special lines to an adjacent macrocell.

Some CPLDs, such as XC7300 series CPLDs and XC9500 series CPLDs produced by Xilinx, Inc. of San Jose, Calif., incorporate "cross-point" interconnect matrices. Cross-point interconnect matrices include a plurality of parallel word (input) lines arranged perpendicular to a plurality of parallel bit (output) lines. At the intersections of the word lines and bit lines are programmable connection circuits. Each programmable connection includes a memory cell which is programmed to either connect or disconnect one word line to/from one bit line. The word lines receive signals input to the CPLD, and feedback signals from the macrocells. Selected bit lines are connected to the word lines via the programmable connections to route input and feedback signals into selected function blocks. Cross-point interconnect matrices are characterized in that every word line is programmably connectable to every bit line, thereby providing the advantage of 100% routability—that is, every word line can be connected to every bit line within a cross-point interconnect matrix. Another advantage of cross-point interconnect matrices is that two or more signals on the word lines can be logically ANDed together before transmission to the function blocks. One cross-point interconnect matrix is described in U.S. Pat. No. 5,028,821, and is also described in co-owned U.S. Pat. No. 5,530,378, which is incorporated herein in its entirety.

Long time users of CPLDs are aware of switching (coupling) noises in the interconnect matrix when multiple unrelated word lines are switched concurrently. This noise is believed to occur because of two primary phenomena: a) capacitive coupling between word lines and bit lines of the interconnect matrix, and b) noise on the internal power buses of the CPLD because of excessive concurrent word line switching. The result of this switching noise is a reduced effective clock rate of approximately 30% in typical cases.

Capacitive coupling occurs, for example, when word line voltage potentials are simultaneously shifted from high to low, or from low to high. As an example, when several macrocells of an CPLD implement a counter, the output signals from all of these macrocells switch from high to low when the counter "turns over" (i.e., every macrocell simultaneously shifts from a "1" to a "0"). In addition, the counter is typically driven by a common clock signal, so that all of the macrocells switch concurrently. Concurrent multiple switching events also occur when several macrocells are cleared simultaneously. These concurrent multiple macrocell switching events cause a large capacitive effect (coupling) between the bit lines and word lines of the CPLD, thereby resulting in bit line noise.

Noise also occurs on the internal power buses when a large number of word lines are switched simultaneously from high to low, or from low to high. Simultaneous switching creates a crowbar effect which causes large fluctuations in the voltage level of the power buses.

One known method of addressing the issue of noise produced by concurrent multiple macrocell switching events is disclosed in U.S. Pat. No. 5,617,041. The disclosed method recognizes that, when an CPLD is used to implement a logic function, several of the CPLD's macrocells are typically not utilized to implement the logic function. In accordance with the method disclosed in U.S. Pat. No. 5,617,041, these unused macrocells are programmed to transmit feedback signals into the interconnect matrix which are opposite in polarity with commonly clocked word line switching signals, thereby producing counteractive word line switching signals which reduces switching noise in the interconnect matrix.

A problem with the method disclosed in U.S. Pat. No. 5,617,041 is that it relies on the availability of unused macrocells. In applications where there are only a few unused macrocells, the method typically cannot produce sufficient counteractive signals to significantly reduce switching noise. In addition, even if there are unused macrocells available, the software will be required to map the logic required for the specified equation into the macrocell. This is not always possible because of the input and P-term restrictions due to the CPLD architecture. Further, in applications where low power consumption is important, the utilization of otherwise unused macrocells to produce counteractive word line switching signals significantly increases power consumption of the CPLD.

SUMMARY OF THE INVENTION

In accordance with the present invention, a method is provided for reducing switching noise caused by coupling between word lines and bit lines within an interconnect matrix which addresses the above problems associated with the known method by inverting approximately one-half of the feedback signals entering the interconnect matrix, and re-inverting the inverted feedback signals before they are applied to a subsequent macrocell. This effectively eliminates concurrent multiple macrocell switching events because while approximately one-half of the macrocell switching events remain, for example, low-to-high, the other approximately one-half of the macrocell switching events become high-to-low, thereby creating a cancelling effect which reduces switching noise. Further, because the present method does not rely on unused macrocells, noise reduction can be achieved even in densely utilized CPLDS. Moreover, low power consumption is achieved because unused macrocells remain dormant.

In accordance with the present invention, the noise reduction method is utilized while programming of a programmable logic device (PLD) having an interconnect matrix which includes a plurality of input (word) lines and a plurality of output (bit) lines, each input line being connected to each output line by a programmable connection circuit. The PLD also includes a plurality of macrocells, each macrocell having an output programmably connectable to one of the input lines, and an input programmably connectable to the output lines. The method begins by selecting a first macrocell which is utilized by logic design software to generate a feedback signal which is routed through the interconnect matrix to the input of a second macrocell. The method then generates a random command to either invert or not-invert the feedback signal. If the generated random command is to invert the feedback signal, the method then inverts the feedback signal transmitted on the first input line, and re-inverts the inverted feedback signal transmitted from the interconnect matrix to the second macrocell.

In accordance with an aspect of the present invention, the steps of inverting and re-inverting include programming selectively programmable signal inversion circuits which are located between the output of the first macrocell and the interconnect matrix, and between the output of the interconnect matrix and the input of the second macrocell such that the feedback signal is inverted before entering the interconnect matrix, and is re-inverted upon leaving the interconnect matrix.

In accordance with one embodiment, the step of generating a random command utilizes a random number generator.

In accordance with another embodiment, the step of generating a random command utilizes a toggle circuit which alternates sequentially-generated random commands between invert and not-invert.

In accordance with another embodiment, the inverting/re-inverting step is only performed if the feedback signal output from the first macrocell is not utilized to provide an interconnect matrix ANDing function.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention is directed to a method of preventing concurrent multiple macrocell switching events which utilizes an optional polarity control feature provided on certain PLDs (such as members of the XC7300 and XC9500 CPLD families manufactured by Xilinx, Inc. of San Jose, Calif.). This feature allows a user to change the signal polarity (from true to complement) of each feedback signal transmitted on the word line into an interconnect matrix, and to change the signal polarity of signals transmitted from the interconnect matrix to a subsequent macrocell. The original purpose for this optional polarity control is to allow a user to take advantage of the logic (ANDing) capabilities of the cross-point-type interconnect matrix, thereby freeing macrocells, otherwise used for the AND function, for implementing portions of the user's logic function. The present method utilizes the optional polarity control in a novel manner to reduce noise in the interconnect matrix of a CPLD by inverting some (approximately half) of the macrocell feedback signals, thereby preventing concurrent multiple macrocell switching events.

The present programming method is described with particular reference to the XC9500 CPLD family manufactured by Xilinx, Inc. of San Jose, Calif. However, the present invention is not limited to the devices of the XC9500 CPLD family in that it is applicable to any PLD (such as members of the XC7300 CPLD family) which includes the above-mentioned optional polarity control feature.

A brief description of the XC9500 CPLD family is provided below. Additional description of the XC9500 CPLD family is provided pages 3-3 to 3-16 of *The Programmable Logic Data Book*, 1996, published by Xilinx, Inc., are being incorporated herein by reference.

CPLD Structure

Figure 1:
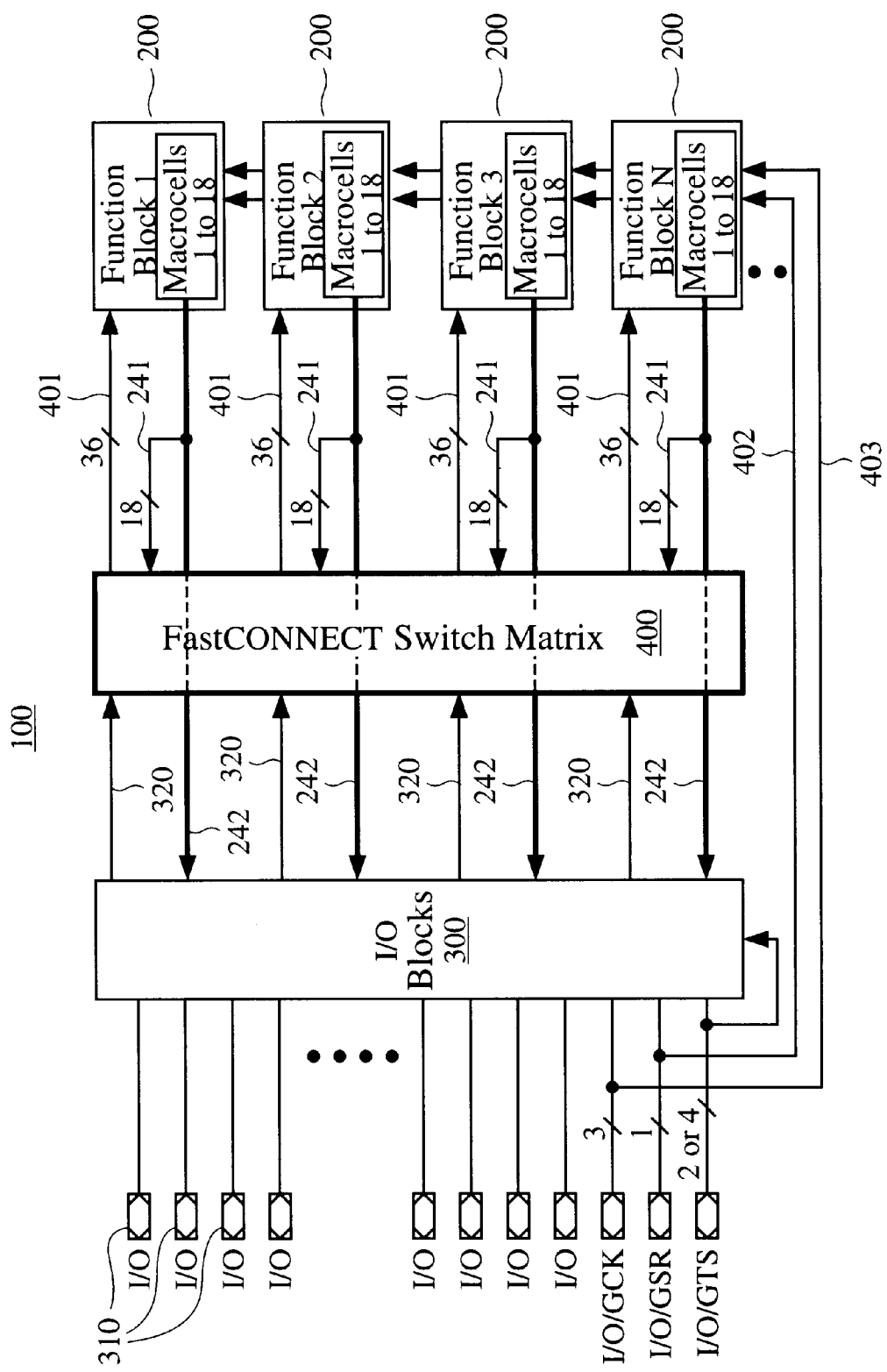
FIG. 1 is a block diagram showing a CPLD of the Xilinx XC9500 CPLD family.

FIG. 1 is a block diagram of a CPLD 100 which includes features common to the XC9500 CPLD family. Each CPLD 100 of the XC9500 CPLD family consists of multiple function blocks (FBs) 200 (four shown) and input/output (I/O) modules 300 which are interconnected by a FastCONNECT™ Switch Matrix (FSM) (interconnect matrix) 400. I/O modules 300 provide buffering for device inputs and outputs which are applied to input/output (I/O) pins 310. All input signals from the I/O modules 300 enter FSM 400 via FSM input lines 320. Output signals from FBs 200 are either fed-back into FSM 400 on macrocell feedback lines 241, or transmitted to I/O modules 300 on macrocell output lines 242. Each FB 200 receives thirty-six (36) inputs on FB input lines 401 from FSM 400, and produces ninety (90) P-term elements which are applied to any of eighteen (18) macrocells, each macrocell being programmable to provide a sum-of-products term from selected P-term elements. For each FB 200, twelve to eighteen outputs are selectively transmitted on macrocell output lines 242 to directly drive I/O modules 300 (along with optional corresponding output enable signals). In addition, each FB 200 selectively receives global set/reset signals and global clock signals on global set/reset lines 402 and global clock lines 403, respectively.

Figure 2:
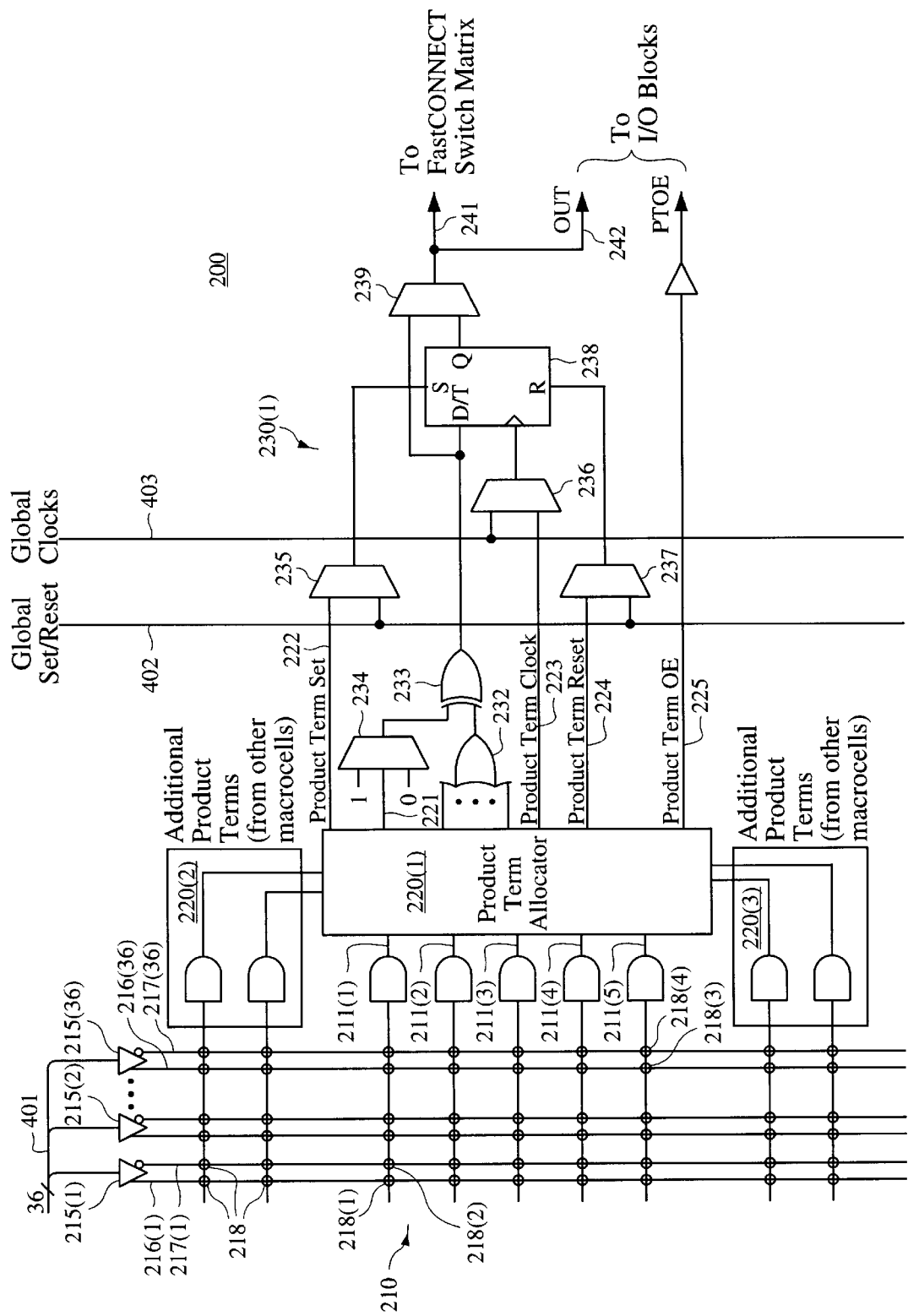
FIG. 2 is a simplified schematic diagram illustrating a portion of a function block of the CPLD shown in FIG. 1.

FIG. 2 is a simplified schematic diagram showing a portion of one FB 200. Each FB 200 includes an AND array 210, product term allocators 220 and macrocells 230 (of which macrocell 230(1) is shown).

In accordance with a first aspect of the present invention, CPLD 100 includes a first selectively programmable signal inversion circuit for inverting signals output from FSM 400 such that each FSM output signal is selectively transmitted to a subsequent P-term in true (non-inverted) or complement (inverted) polarity. In CPLD 100, the first selectively programmable signal inversion circuits are implemented by AND array 210. AND array 210 receives thirty-six (36) input signals on input lines 401 from FSM 400 such that each input signal is applied to one of thirty-six (36) buffers 215(1) through 215(36). Each buffer 215(1) through 215(36) outputs a true (non-inverted) signal on an associated true AND-array line 216(1) through 216(36), and a complement (inverted) signal on an associated complement AND-array line 217(1) through 217(36). Each of the true AND-array lines 216(1) through 216(36) and complement AND-array lines 217(1) through 217(36) is programmably connectable to each P-term line 211 (nine shown) via a programmable connection 218 (discussed below). For example, true AND-array line 216(1) is connectable to P-term line 211(1) by programming a memory cell (not shown) associated with programmable connection 218(1). Alternatively, complement AND-array line 217(1) is connectable to P-term line 211(1) by programming a memory cell associated with programmable connection 218(2). By selectively connecting the AND-array line (216 or 217) associated with a particular input signal, a user controls the polarity of the signal applied to a selected P-term line 211. Of course, other selectively programmable signal inversion circuits may be used in place of AND array/P-term line connection described above.

Eighteen product term allocators 220 programmably connect the ninety P-term lines 211 to the eighteen macrocells 230 of FB 200. In particular, product term allocators 220 programmably connect five "direct" P-term lines 211 and up to eighty-five (85) "imported" P-term lines 211 to a selected macrocell 230. For example, referring to FIG. 2, product term allocator 220(1) is programmable to connect P-term lines 211(1) through 211(5) to OR gate 232, XOR gate 233 (on XOR MUX line 221 and through XOR MUX 234), to Set MUX 235 (on P-term set line 222), to Clock MUX 236 (on P-term clock line 223), to Reset MUX 237 (on P-term reset line 224), and to provide the optional OE signal (on P-term output-enable line 225). In addition, product term allocator 220(1) selectively applies "imported" P-term lines from neighboring product term allocators 220(2) and 220(3) to OR gate 232.

Within macrocell 230(1), XOR MUX 234 is programmable to apply the signal on XOR MUX line 221, a logic "1", or a logic "0" to a first input terminal of XOR gate 233. OR gate 232 generates a sum-of-products term which is applied to the second input terminal of XOR gate 233. The output of XOR gate 233 is selectively transmitted through D/T flip-flop (D/T FF) 238 and FF MUX 239 as a registered output signal, or directly through FF MUX 239 as a combinatorial output signal transmitted on macrocell feedback line 241 or macrocell output line 242. The remaining P-term lines selectively provide optional control signals for D/T FF 238 (when a registered output signal is generated), and/or provide optional OE control (when the output is directed to an I/O pin 310). Specifically, Set MUX 235 selectively passes the signal on P-term set line 222 or a global set signal (received on one of the global set/reset lines 402) to the set (S) terminal of D/T flip-flop 238. Clock MUX 236 selectively passes the signal on P-term clock line 223 or a global clock signal (received on one of the global clock lines 403) to the clock (>) terminal of D/T flip-flop 238. Reset MUX 237 selectively passes the signal on P-term reset line 224 or a global reset signal (received on one of the global set/reset lines 402) to the reset (R) terminal of. D/T flip-flop 238. Finally, as discussed above, P-term OE line 225 is directed to one of the I/O modules 300 (see FIG. 1).

Figure 3:
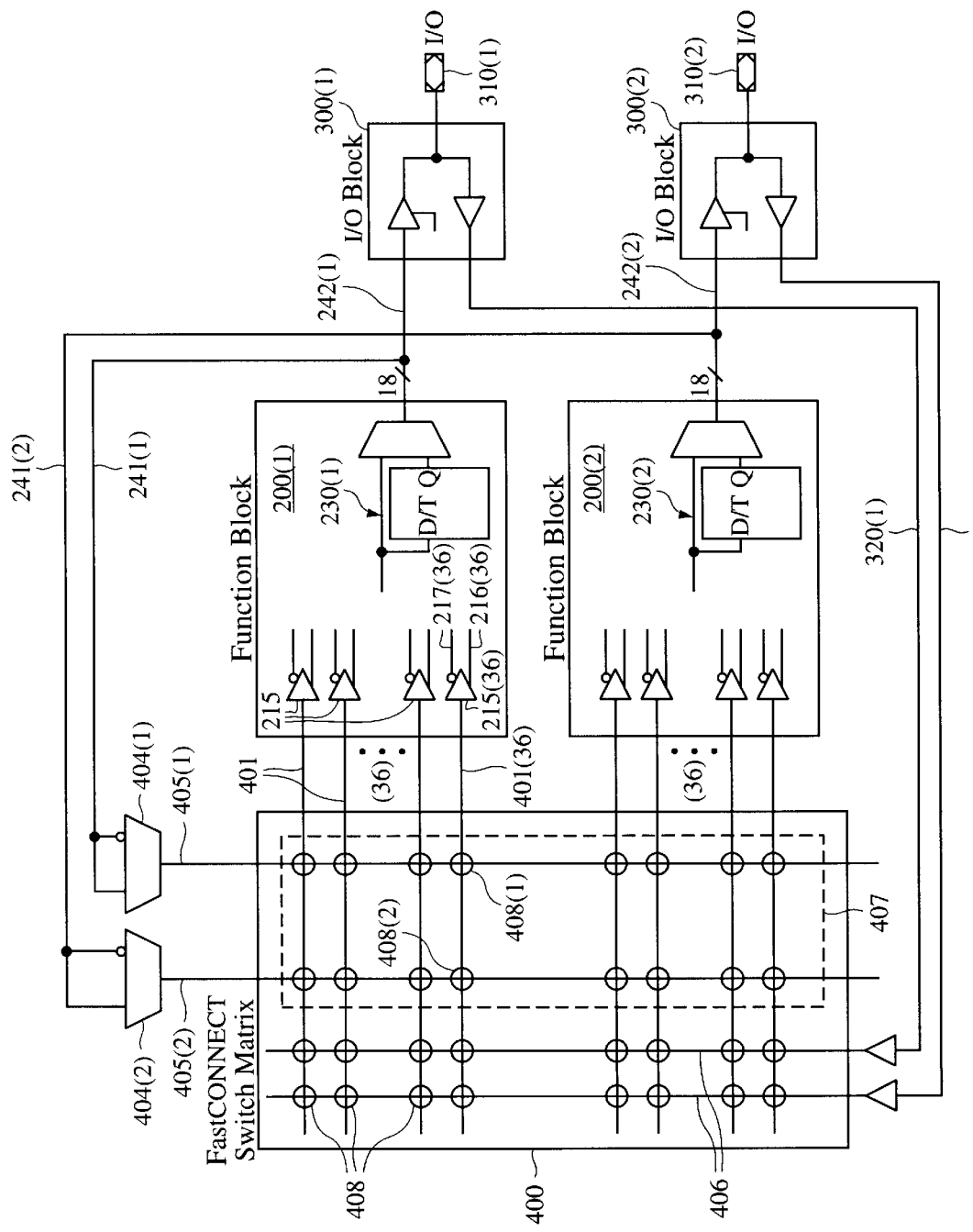
FIG. 3 is a simplified schematic diagram illustrating an interconnect matrix of the CPLD shown in FIG. 1.

FIG. 3 is a simplified circuit diagram illustrating the operation of FSM 400. Feedback signals from macrocells 230(1) and 230(2) of FBs 200(1) and 200(2) are transmitted via macrocell feedback lines 241(1) and 241(2), respectively, to FSM input (word) lines 405(1) and 405(2) via FSM input MUXs 404(1) and 404(2). Input signals from I/O modules 300(1) and 300(2) are respectively transmitted on input lines 320(1) and 320(2) to FSM input (word) lines 406. All of FSM input lines 405 and 406 are programmably connected to each of the FSM output (bit) lines 401 via programmable connections 408 (discussed below). As discussed above, FSM output lines 401 transmit signals to buffers 215 of FBs 200(1) and 200(2).

In accordance with a second aspect of the present invention, a second selectively programmable signal inversion circuit is provided for inverting feedback signals such that each feedback signal on feedback lines 241 is selectively transmitted into FSM 400 in true or complement polarity. Specifically, the second selectively programmable signal inversion circuits are implemented by FSM input MUXs 404. Each FSM input MUX 404 is connected between one feedback line 241 and one FSM input line 405. The select input to each FSM input MUX 404 is programmed by a memory cell (not shown) to apply a true (non-inverted) or a complement (inverted) feedback signal on an associated FSM input line 405. Of course, other selectively programmable signal inversion circuits may be used in place of FSM input MUXs 404.

Figure 4:
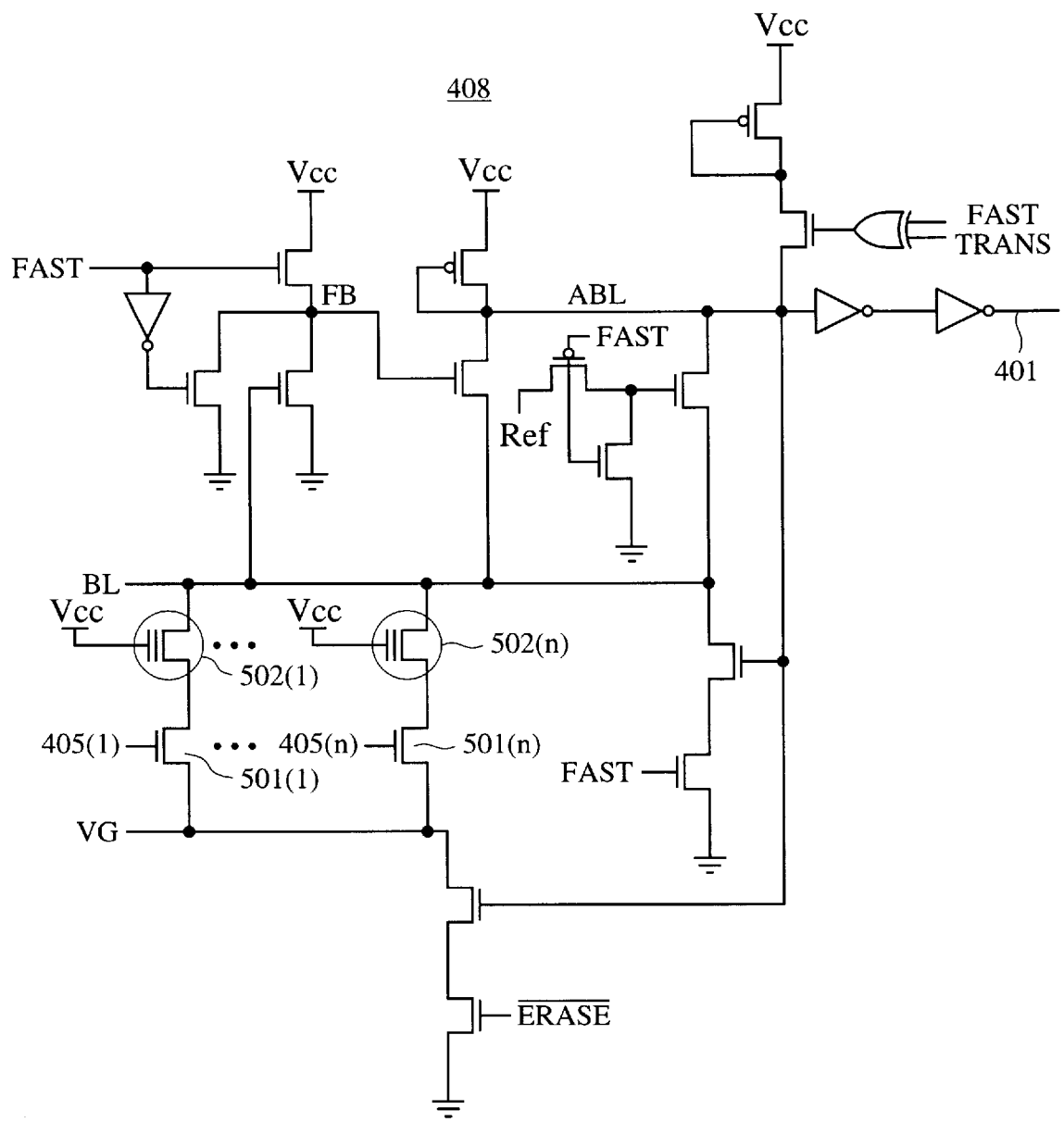
FIG. 4 is a simplified circuit diagram of a programmable connection circuit utilized in the interconnect matrix of the CPLD shown in FIG. 1.

FIG. 4 shows a programmable connection circuit 408 in accordance with an embodiment of the present invention. The operation and function of the disclosed programmable connection 408 is provided in co-owned U.S. Pat. No. 5,617,041, which is incorporated herein by reference. Each of FSM input lines 405(1) through 405(n) is coupled to the gate of one access transistor 501(1) through 501(n). The source of each access transistor 501(1) through 501(n) is connected to virtual ground line VG. EPROM cells 502(1) through 502(n) are respectively connected between access transistors 501(1) through 501(n) and bit line BL, and include control gates connected to internal power bus Vcc.

In operation, one or more selected FSM input lines 405(1) through 405(n) are "connected" to bit line BL by erasing (rendering conductive) an associated EPROM cell 502 using methods known in the art. For example, EPROM 502(1) is erased to connect FSM input line 405(1) to bit line BL, and a subsequent high signal on FSM input line 405(1) turns on access transistor 501(1), thereby connecting bit line BL to ground through EPROM 502(1) and access transistor 501(1). When bit line BL is pulled low, FSM output line 401 is also pulled low. Further, FSM 400 can be utilized to perform logic AND functions of two or more feedback signals by connecting the associated FSM input lines 405(1) through 405(n) to bit line BL by erasing the associated EPROM cells 502(1) through 502(n). When any of the connected feedback signals is high, the FSM output line 401 is switched to low—that is, FSM output line 401 remains high only if all of the connected feedback lines are low. This feature is used to implement logic AND operations within FSM 400, thereby potentially permitting use of macrocells 200 for other logic operations of a user's logic function.

Definitions

To facilitate the description of the key concepts associated with the optimization method of the present invention, the following definitions are adopted.

As used herein, the terms "resource", "logic resource" and "interconnect resource" refer to the elements and interconnect lines of a PLD which are programmable to implement a user's logic function. For example, each macrocell 230 of an XC9500 CPLD is programmable to implement a portion of a user's logic function which is representable in a sum-of-products form. Therefore, in the context used herein, each macrocell 230 of an XC9500 CPLD meets the definition of a logic resource of a CPLD. For convenience, the term "logic resource" is also used to refer to I/O modules 300. Similarly, the programmable interconnect lines associated with the function blocks 200, the I/O modules 300, the FSM 400 meet the definition of interconnect resources of a CPLD. The term bresource encompasses both logic resources and interconnect resources. Further, as known to those of ordinary skill in the art, other types of PLDs such as field programmable gate arrays (FPGAs) implement logic functions using different types of logic elements (for example, look-up tables) and interconnect schemes. The term "resource" is intended to also cover these different types of logic elements and interconnect schemes.

As used herein, the term "logic portion" refers to the portion of a user's logic function implemented by a logic resource of a PLD. For example, as described above, up to ninety (90) P-term lines of a given FB 200 are usable by a single macrocell by programming the product term allocator 220 to connect the five assigned P-term lines of the macrocell 230 and the eighty-five (85) remaining P-term lines of the FB 200 to the OR gate 232 of the macrocell 230. As such, each macrocell 230 of an XC9500 CPLD is programmable to implement a small or large logic portion of a user's logic function which is representable as a sum-of-products term. Therefore, in the context used herein, each sum-of-products term (made up of a number of P-terms fed to the OR gate 232 of a macrocell 230) meets the definition of a "logic portion".

As used herein, the phrase "place and route" refers to the process of assigning each sum-of-products term to a specific logic resource (e.g., a macrocell 230 of a function block 200) of a target PLD, and the process of assigning interconnect resources of the target PLD to connect the logic resources such that the sum-of-products terms collectively emulate the user's logic function.

Programming Method

A CPLD programming method according to the present invention will now be discussed with reference to FIGS. 5 and 6.

System Context of the Invention

Figure 5:
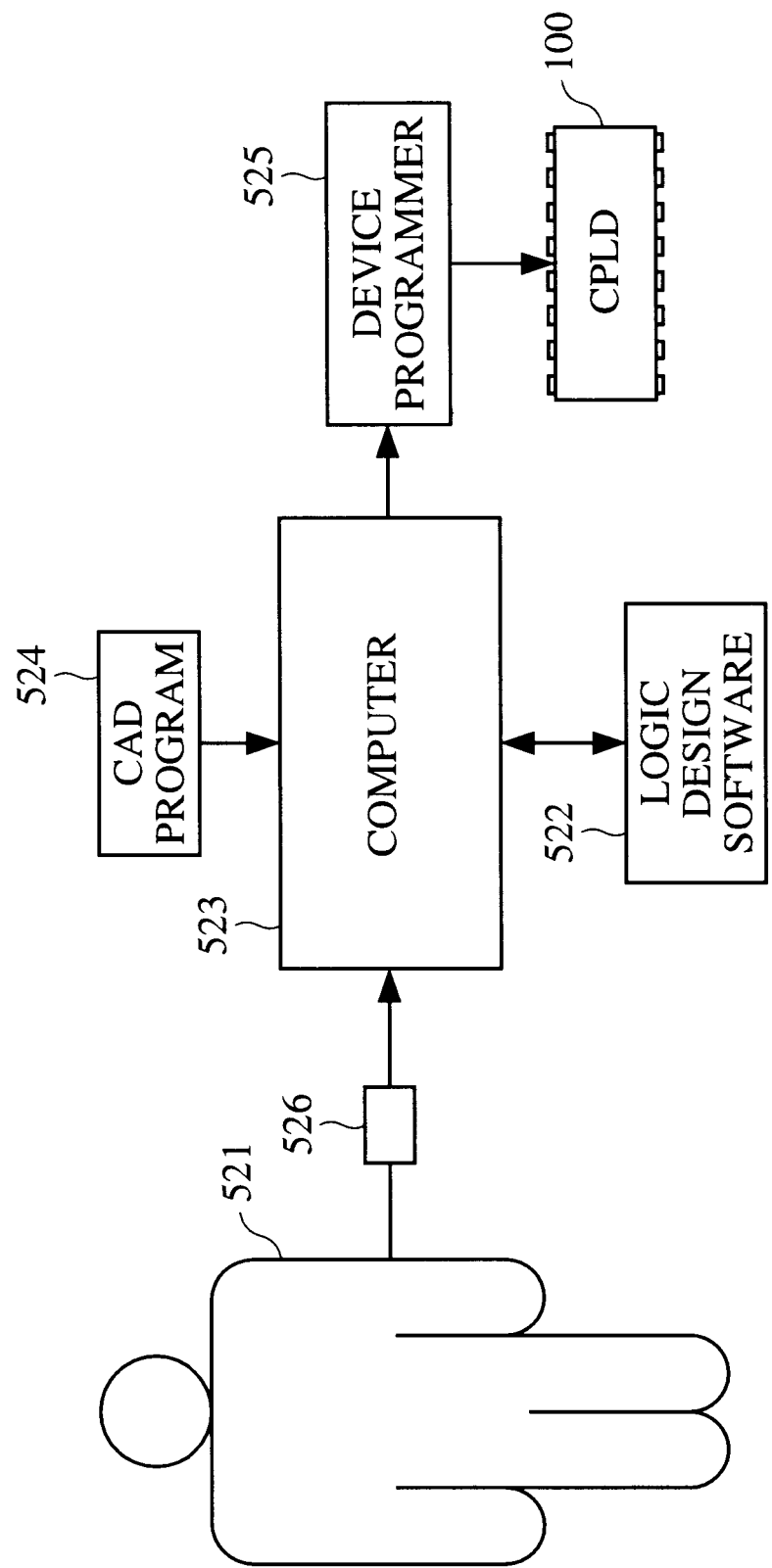
FIG. 5 is a block diagram illustrating a system for programming a CPLD using the power/slew optimization method of the present invention.

FIG. 5 shows a "machine" for programming a CPLD 100 in accordance with the present invention. A human user 521 provides the CPLD 100 to be programmed and utilizes an input device 526 to specify the logic function (circuit design) which the CPLD 100 is to implement. Logic design software 522 and CAD software 524 (jointly referred to herein as the "high level program") operating in a computer 523 take the logic function specified by the user 521 and determine how to "place and route" the logic efficiently onto the CPLD 100, and also how to perform the noise reduction method in accordance with the present invention. Logic design software 522 is used to carry out the "place and route" process, and to perform the noise reduction method steps shown in FIG. 6 and described below. If the specified logic function is represented in a schematic or-high-level language format, the logic design software 522 may be used to transform the function from that format to a set of Boolean terms prior to performing the "place and route" process. The set of Boolean terms includes both sequential (registered) terms and combinatorial terms. Such format transformation procedures and "place and route" processes are well known in the art and readily available. The programming method shown in FIG. 6, however, discloses aspects particular to the present invention. The CAD software 524 is used after'the logic design software 522, and produces a bit-map file that indicates to a device programmer 525 the values to program into the CPLD 100. This bit-map file, also known as a hex file, is a list of the programmable connections of the AND-array and OR-array of each function block, of the logic expander or interconnect matrix, and other setting of the CPLD 100. The device programmer 525 physically programs the contents of the bit-map file into the CPLD 100. The physical form of the programming or configuring depends on the manufacturing technology of the CPLD 100. If, for example, the CPLD 100 is an EPROM or EEPROM device, the EPROM or EEPROM cells are programmed by charging or discharging a floating gate or other capacitance element. Other PLD devices may be programmed using similar device programmers by blowing fuses. One device programmer 525 that may be used is the HW-130 available from Xilinx, Inc. of San Jose, Calif. It connects to computer 523 via an RS232 serial port. A software driver, which is provided for the HW-130 by Xilinx, Inc., downloads programs and data from the computer 523 to the device programmer 525. Thus, the interacting elements 522–526 of the machine in FIG. 5 carry out a process that reduces the CPLD 100 from an unprogrammed state to programmed state that can carry out the specified logic function.

Noise Reduction Method

The noise reduction method according to the present invention is performed after the logic design software 522 (see FIG. 5) has placed and routed the user's logic function vis-a-vis a target PLD, and before the device programmer 525 is driven to physically program the target PLD. Therefore, in the following discussion, references to the circuit and schematic diagrams shown in FIGS. 2 and 3 are provided for explanatory purposes only—i.e., these references are directed to data stored in computer 523 which is associated with physical resources of the target CPLD, and not to the actual physical resources.

In accordance with the present invention, the noise reduction method alters the polarity of feedback signals only for logic portions which do not utilize the logic (ANDing) capabilities of the interconnect matrix (if available in the target CPLD).

The noise reduction method according to the present invention will now be explained in detail with reference to the flow diagram of FIG. 6.

In step 610, the macrocells of the target CPLD are systematically selected for noise reduction analysis. That is, each time step 610 is called, one macrocell of the target CPLD is selected which has not been considered for noise reduction. The program ends (END) when all macrocells of the target CPLD have been considered. Once a macrocell is selected, control passes to step 620.

In step 620, analysis is performed to determine whether the selected macrocell is utilized in interconnect matrix 400. This analysis typically involves accessing data stored in computer 523 which is associated with the selected macrocell to determine whether the output of the selected macrocell is used to implement the logic in another macrocell. If the output of the selected macrocell is not used to implement the logic in another macrocell (NO), then control passes back to step 610 for selection of another macrocell. If the output of the selected macrocell is used to implement the logic in another macrocell (YES), then control passes to step 630.

In optional step 630, the selected macrocell is analyzed to determine whether the output from the selected macrocell is utilized in a logic AND function within the interconnect matrix. This information is similarly obtained by accessing data associated with the interconnect matrix. If the output from the selected macrocell is utilized in interconnect ANDing (YES), then control passes back to step 610 for selection of another macrocell. If the selected macrocell is designated for interconnect matrix ANDing (NO), then control passes to step 640. Step 630 is optional because, if the target CPLD does not include a cross-point interconnect matrix, then this step may be omitted and control passed from step 620 to step 640.

In step 640, a command is generated to either "invert" or "do-not-invert" the feedback signal. In one embodiment, the command may be obtained from a random number generator such that each command has a "fifty-fifty" chance of being "invert" or "do-not-invert". In another embodiment, a toggle circuit may be used to sequentially generate the command (i.e., each pass through step 640 switches the toggle circuit from "invert" to "do-not-invert"). Other command generators may be used, provided that approximately 50% of the feedback signals are inverted. Control then passes to step 650.

Step 650 is a decision block in which the command generated in step 640 is analyzed. If the command generated in step 640 is "do-not-invert", then control passes back to step 610 for selection of another macrocell. If the command generated in step 640 is "invert", then control passes to step 660.

In step 660, the feedback signal from the selected macrocell is inverted before entering the interconnect matrix. In particular, the selectively programmable signal inversion resources of the target CPLD which are associated with the feedback signal from the selected macrocell are programmed to invert the feedback signal before transmitting the feedback signal to a programmable connection of the interconnect matrix. Control then passes to step 670.

Finally, in step 670, the inverted feedback signal output from the interconnect matrix is re-inverted before entering a subsequent macrocell. In particular, each P-term where this inverted feedback signal is used must be re-inverted. For example referring to FIG. 2, if the inverted feedback signal is received on input line 215(1) and the programmable connection 218(1) is to be programmed, then programmable connection 218(2) is programmed instead of programmable connection 218(1). This is logically equivalent to the original logic design. Thus, the selectively programmable signal inversion resources of the target CPLD which are connected between the output line of the interconnect matrix and the input of a subsequent macrocell are programmed to invert the feedback signal so that the signal is received in its true polarity. Control then returns to step 610 for selection of another macrocell.

EXAMPLE

The disclosed method is described in the following example which references the CPLD 100 disclosed in FIGS. 1–4.

The following assumptions are made for purposes of this example. First, referring to FIG. 3, it is assumed that a user's logic function is placed and routed relative to the target CPLD 100 such that a portion of the logic function includes a feedback signal transmitted from macrocell 230(2) to macrocell 230(1) via feedback line 241(2), the non-inverted input of FSM input MUX 404(2), programmable connection 408(2), FSM output line 401(36), and true AND-array line 216(36). Second, referring to FIG. 2, it is assumed that the feedback signal is applied to macrocell 230(1) via programmable connection 218(3) and P-term line 211(5). Finally, it is assumed that the feedback signal is not utilized in a logic AND function-within FSM 400.

Applying the above-described method steps to the established example, assume macrocell 230(2) is selected in step 610, and control passes to step 620. Because macrocell 230(2) contains a portion of the user's logic function (YES), control passes from step 620 to step 630. Based on the above-mentioned assumption, because the feedback signal is not utilized in an interconnect matrix AND function (NO), control passes to step 640. For purposes of explanation, assume that the random command generated in step 640 is "invert", and control passes through step 650 to step 660. In step 660, the step of inverting the input into the interconnect matrix 400 is performed by programming the memory cell associated with FSM input MUX 404(2) to invert the feedback signal applied to FSM input line 405(2) (i.e., programming the FSM input MUX 404(2) to pass the feedback signal through its inverted input). Next, in step 670, the inverted feedback signal is re-inverted by re-programming the memory cell associated with the programmable connection 218(3), and programming the memory cell associated with the programmable connection 218(4), thereby connecting complementary AND-array line 217(36) to the P-term line 211(5).

Conclusion

Based on experimental data, the noise reduction method in accordance with the present invention was used to provide a 30% increase in the effective clock rate in an XC9500 family CPLD. In addition, the present method does not rely on the availability of unused macrocells, so the present method is effective even in densely utilized CPLDs. A further benefit is realized in that the present method does not utilize otherwise dormant macrocells, thereby keeping power consumption as low as possible.

Figure 6:
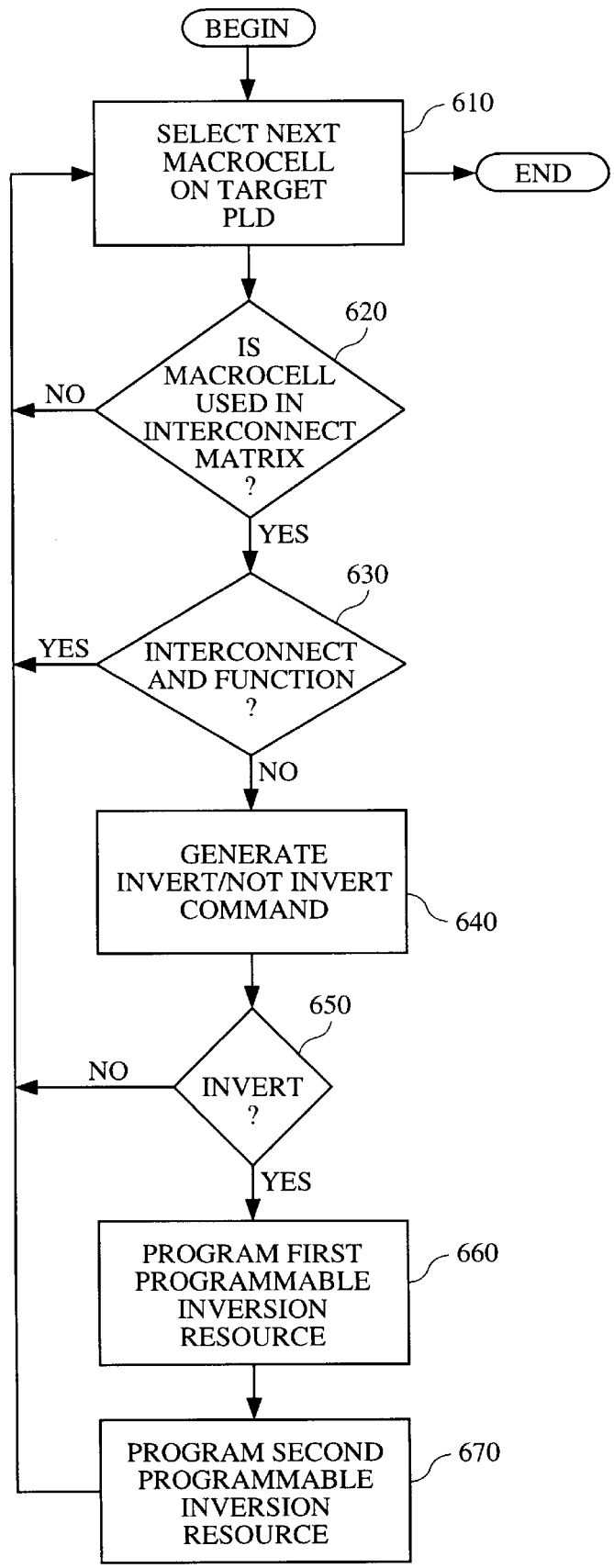
FIG. 6 is a flow diagram showing the basic logic steps of the power/slew optimization method according to the present invention.

The method shown in FIG. 6 is merely illustrative, and it is recognized that several variations are possible. For example, the-process may omit step 630 when the target CPLD does not facilitate interconnect matrix ANDing. Further, the order in which the method steps are performed may be altered without changing the beneficial results of the present invention. Further, other PLDs may provide different resources for inverting feedback signals to and from the macrocells. In view of the above-mentioned alternative embodiments, the spirit and scope of the appended claims should not be limited to the description of the embodiment related to FIG. 6, contained herein.

I claim:

1. A method for reducing switching noise in an interconnect matrix of a programmable logic device (PLD), the interconnect matrix including a plurality of input lines and a plurality of output lines, each input line being connectable to each output line by a programmable connection circuit, the PLD also including a plurality of macrocells, each macrocell having an output programmably connectable to one of the input lines, and an input programmably connectable to the output lines, the method comprising the steps of:

selecting a first macrocell generating a feedback signal which is routed to the input of a second macrocell via a first input line and a first output line of the interconnect matrix;

generating a command to either invert or not-invert the feedback signal; and if the command is to invert the feedback signal:
  inverting the feedback signal transmitted on the first input line; and
  re-inverting the inverted feedback signal transmitted from the interconnect matrix to the second macrocell.

2. The method according to claim 1, wherein the step of generating a command comprises utilizing a random number generator.

3. The method according to claim 1, wherein the step of generating a command comprises utilizing a toggle circuit which alternates sequentially-generated commands between invert and not-invert.

4. The method according to claim 1, wherein the steps of inverting-and re-inverting are only performed if the feedback signal output from the first macrocell is not utilized to provide an interconnect matrix ANDing function.

5. A method for reducing coupling noise in an interconnect matrix of a programmable logic device (PLD), the interconnect matrix including a plurality of input lines and a plurality of output lines, each input line being connected to each output line by a programmable connection circuit, the PLD also including a plurality of macrocells, each macrocell having an output programmably connectable to one of the input lines via an associated first selectively programmable signal inversion circuit, and an input programmably connectable to the output lines via an associated second selectively programmable signal inversion circuits, the method comprising the steps of:

placing and routing a logic function such that portions of the logic function are implemented by some of the macrocells;

selecting a first macrocell generating a feedback signal which is routed to the input of a second macrocell via a first input line and a first output line of the interconnect matrix;

generating a command to either invert or not-invert the feedback signal; and if the generated random command is to invert the feedback signal:
  programming the associated first selectively programmable signal inversion circuit to invert the feedback signal transmitted on the first input line, and
  programming the associated second selectively programmable signal inversion circuit to re-invert the inverted feedback signal transmitted from the interconnect matrix to the second macrocell.

6. The method according to claim 5, wherein the step of generating a command comprises utilizing a random number generator.

7. The method according to claim 5, wherein the step of generating a command comprises utilizing a toggle circuit which alternates sequentially-generated commands between invert and not-invert.

8. The method according to claim 5, wherein the associated first selectively programmable signal inversion circuit comprises a multiplexer having a first input connected to the output of the first macrocell, a second input connected to the output of the first macrocell via an inverter, and an output connected to the first input line of the interconnect matrix;

wherein the step of programming the associated first selectively programmable signal inversion circuit comprises setting a memory cell associated with the multiplexer such that the output of the macrocell is connected to the first input line of the interconnect matrix through the second input and the inverter.

9. The method according to claim 5, wherein the associated second selectively programmable signal inversion circuit comprises:

a buffer having an input connected to the output line of the interconnect matrix, a first output for transmitting the inverted feedback signal, and a second output for transmitting the re-inverted feedback signal, and a product-term line programmably connected to the first output via a first programmable connection, and to the second output of the buffer via a second programmable connection, the product term line being connected to the input of the macrocell;

wherein the step of programming the associated second selectively programmable signal inversion circuit comprises programming the first programmable connection to disconnect the product-term line from the first output, and programming the second programmable connection to connect the product-term line to the second output.

10. The method according to claim 5, wherein the steps of programming the associated first selectively programmable signal inversion circuit and programming the associated second selectively programmable signal inversion circuit are only performed if the feedback signal output from the first macrocell is not utilized to provide an interconnect matrix ANDing function.

* * * * *